US008394665B2

(12) United States Patent
Hotta et al.

(10) Patent No.: US 8,394,665 B2
(45) Date of Patent: Mar. 12, 2013

(54) ORGANIC THIN FILM TRANSISTORS, ORGANIC LIGHT-EMISSIVE DEVICES AND ORGANIC LIGHT-EMISSIVE DISPLAYS

(75) Inventors: Sadayoshi Hotta, Osaka (JP); Jonathan Halls, Cambridge (GB); Gregory Whiting, Menlo Park, CA (US)

(73) Assignees: Cambridge Display Technology Limited, Cambridgeshire (GB); Panasonic Corporation, Osaka (JP)

( * ) Notice: Subject to any disclaimer, the term of this patent is extended or adjusted under 35 U.S.C. 154(b) by 167 days.

(21) Appl. No.: 12/664,015
(22) PCT Filed: Jun. 13, 2008
(86) PCT No.: PCT/EP2008/057517
§ 371 (c)(1),
(2), (4) Date: Apr. 22, 2010
(87) PCT Pub. No.: WO2009/000683
PCT Pub. Date: Dec. 31, 2008

(65) Prior Publication Data
US 2010/0203663 A1 Aug. 12, 2010

(30) Foreign Application Priority Data
Jun. 22, 2007 (GB) ................... 0712269.0

(51) Int. Cl.
H01L 51/40 (2006.01)
(52) U.S. Cl. ............. 438/99; 257/40; 257/E21.007
(58) Field of Classification Search ............ 438/99; 257/40
See application file for complete search history.

(56) References Cited

U.S. PATENT DOCUMENTS

| | | | |
|---|---|---|---|
| 5,723,873 A | 3/1998 | Yang | |
| 5,798,170 A | 8/1998 | Zhang et al. | |
| 7,029,945 B2 * | 4/2006 | Veres et al. | 438/99 |
| 7,118,937 B2 * | 10/2006 | Jang et al. | 438/99 |
| 2003/0092232 A1 | 5/2003 | Klauk et al. | |
| 2004/0041146 A1 | 3/2004 | Cheng et al. | |
| 2005/0133782 A1 | 6/2005 | Klauk et al. | |
| 2006/0088875 A1 | 4/2006 | Jackson et al. | |

FOREIGN PATENT DOCUMENTS

| | | |
|---|---|---|
| EP | 0 901 176 A2 | 1/1999 |
| EP | 0 947 123 B1 | 10/1999 |
| WO | WO-0101502 A2 | 1/2001 |
| WO | WO-2006116584 A2 | 2/2006 |

OTHER PUBLICATIONS

International Search Report and Written Opinion for PCT/EP2008/057517 dated Nov. 21, 2008.
Combined Search Report and Examination Report for GB0712269.0 dated Oct. 19, 2007.
Hanson et al., "Advanced Surface Modification of Indium Tin Oxide for Improved Charge Injection in Organic Devices," *J. Am. Chem. Soc..*, 127:10058-10062 (2005).

* cited by examiner

*Primary Examiner* — Charles Garber
*Assistant Examiner* — Reema Patel
(74) *Attorney, Agent, or Firm* — Marshall, Gerstein & Borun LLP

(57) ABSTRACT

A method of manufacturing an organic thin film transistor, the method comprising: depositing a source and drain electrode; forming a thin self-assembled layer of material on the source and drain electrodes, the thin self-assembled layer of material comprising a dopant moiety for chemically doping an organic semi-conductive material by accepting or donating charge and a separate attachment moiety bonded to the dopant moiety and selectively bonded to the source and drain electrodes; and depositing a solution comprising a solvent and an organic semi-conductive material in a channel region between the source and drain electrode.

29 Claims, 5 Drawing Sheets

ORGANIC THIN FILM TRANSISTORS, ORGANIC LIGHT-EMISSIVE DEVICES AND ORGANIC LIGHT-EMISSIVE DISPLAYS

FIELD OF INVENTION

Aspects of the present invention relates to organic thin film transistors and methods of making the same. Further aspects of the present invention relate to organic light-emissive devices and methods of making the same. Yet further aspects of the present invention relate to organic light emissive displays comprising organic thin film transistors and organic light-emissive devices and methods of making the same.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as P-type and N-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrodes. For example, a P-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an N-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form thin film transistors. When an organic material is used as the semi-conductive material in such a device, it is known as an organic thin film transistor.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to more clearly show the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

One of the challenges with all organic thin film transistors is to ensure a good ohmic contact between the source and drain electrodes and the organic semiconductor (OSC). This is required to minimise contact resistance when the thin film transistor is switched on. A typical approach to minimise extraction and injection barriers, for a p-channel device, is to choose a material for the source and drain electrodes that has a work function that is well matched to the HOMO level of the OSC. For example, many common OSC materials have a good HOMO level matching with the work function of gold, making gold a relatively good material for use as the source and drain electrode material. Similarly, for an n-channel device, a typical approach to minimise extraction and injection barriers is to choose a material for the source and drain electrodes that has a work function that is well matched to the LUMO level of the OSC.

One problem with the aforementioned arrangement is that a relatively small number of materials will have a work function which has a good energy level match with the HOMO/LUMO of the OSC. Many of these materials may be expensive, such as gold, and/or may be difficult to deposit to form the source and drain electrodes. Furthermore, even if a suitable material is available, it may not be perfectly matched for a desired OSC, and a change in the OSC may require a change in the material used for the source and drain electrodes.

One known solution is to provide a thin self-assembled dipole layer on the source and drain electrodes to improve the energy level matching. While not being bound by theory, a thin self-assembled dipole layer may provide a field which shifts the energy levels of the material of the source/drain electrodes and/or the energy levels of the OSC near the source/drain electrodes to improve energy level matching between the OSC and the material of the source/drain.

Although the use of a self-assembled dipole layer can improve matching between the energy levels of the source/drain material and the OSC, the energy levels can only be shifted by a few tenths of an electron volt using this technique. As such, the type of material used for the source and drain electrodes is still relatively restricted. It would be advantageous to be able to use a wide range of materials for the source and drain so that materials can be chosen for their process compatibility. Another problem is that if the thin self-assembled dipole layer is disposed not only on the source/drain electrodes, but also in the channel region, then the performance characteristics of the OSC in the channel region can be adversely affected.

Several other approaches have been used in the prior art in order to improve organic thin film transistor performance.

US 2005/133782 discloses doping of source/drain palladium metal by using of benzo-nitrile or substituted benzo nitriles such as Tetracyanoquinodimethane (TCNQ) in order to facilitate the transfer of charge between the organic semiconductor and the source/drain electrode surface. In contrast to the dipole layers discussed above which merely alter the energy levels of the OSC and/or source and drain using a field effect, the benzo-nitriles chemically dope the OSC by accepting electrons (p-doping). As such, the conductivity of the OSC near the electrodes is increased and charge transfer is facilitated to a much larger extent than utilizing the aforementioned dipole layers.

The nitriles are used directly in US 2005/133782 without being functionalised with groups specially designed for attachment to the source/drain metal. It is described in US 2005/133782 that the dopant nitrile groups can themselves bond to source/drain palladium metal and unbonded dopant can be removed by washing to leave the dopant nitrile groups attached to the source/drain but not in the channel.

It is an aim of certain embodiments of the present invention to provide an improved organic thin film transistor and an improved method of treating source/drain electrodes in order to provide a good ohmic contact between the source/drain electrodes and the organic semiconductor material in an organic thin film transistor.

With reference to FIG. 6, the architecture of an organic light-emissive device is shown. The organic light-emissive device comprises a transparent glass or plastic substrate 100, an anode 102 of, for example, indium tin oxide, and a cathode 104. An organic light-emissive layer 103 is provided between anode 102 and cathode 104.

In operation, holes are injected into the device through the anode and electrons are injected into the device through the cathode. The holes and electrons combine in the organic light-emissive layer to form an exciton which then undergoes radiative decay to give light (in light detecting devices this process essentially runs in reverse).

Further layers may be located between anode 102 and cathode 104, such as charge transporting, charge injecting or charge blocking layers.

In particular, it is desirable to provide a conductive hole injection layer 105 formed of a doped organic material located between the anode 2 and the organic light-emissive layer 3 to assist hole injection from the anode into the layer or layers of semiconducting polymer. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723, 873 and U.S. Pat. No. 5,798,170.

Furthermore, it is desirable to provide a semi-conductive hole transporting layer 106 located between the conductive hole injecting layer 105 and the organic light-emissive layer 103. Preferably, the hole transporting layer 106 has a HOMO level of less than or equal to 5.5 eV, more preferably around 4.8-5.5 eV.

If present, an electron transporting layer located between the organic light-emissive layer 3 and the cathode 4 preferably has a LUMO level of around 3-3.5 eV.

The structure of the illustrated device can also be reversed such that the cathode, rather than the anode, forms the bottom electrode of the device.

It is an aim of certain embodiments of the present invention to provide an improved organic light-emissive device and an improved method of treating a bottom electrode of a light emissive-device in order to provide a good ohmic contact between the bottom electrode and the organic semi-conductor material disposed thereover.

An active matrix organic light-emissive display comprises a matrix of organic light-emissive devices forming the pixels of the display. Each organic light-emissive device comprises an anode, a cathode, and an organic light-emissive layer disposed therebetween as described above.

The pixels of an active matrix organic light-emissive display can be switched between emitting and non-emitting states by altering the current flow through them using a memory element typically comprising a storage capacitor and a transistor.

It is an aim of certain embodiments of the present invention to provide improved active matrix organic light-emissive displays comprising thin film transistors and organic light-emissive devices deposited on a common substrate and improved methods of making the same.

SUMMARY OF THE INVENTION

According to an aspect of the present invention there is provided a method of manufacturing an organic thin film transistor, the method comprising: depositing a source and drain electrode; forming a thin self-assembled layer of material on the source and drain electrodes, the thin self-assembled layer of material comprising a dopant moiety for chemically doping an organic semi-conductive material by accepting or donating charge and a separate attachment moiety bonded to the dopant moiety and selectively bonded to the source and drain electrodes; and depositing a solution comprising a solvent and an organic semi-conductive material in a channel region between the source and drain electrode.

The use of a dopant moiety and a separate attachment moiety allows the dopant moiety to be selected in order to achieve good charge transfer to/from a selected OSC and allows the attachment moiety to be selected in order to achieve good selective attachment to a selected source/drain material but not to the channel dielectric (for a bottom-gate device) or the substrate surface between the source and drain (for a top-gate device).

Such an arrangement provides an improvement over the arrangement disclosed in US 2005/133782 in which the dopant moiety is selected in order to achieve charge transfer and attachment to the source/drain electrodes. In particular, the present invention allows more flexibility for selecting dopant moieties which are good dopants but which may not be good at attaching to certain source/drain electrode materials or have no attachment properties whatsoever. In addition, the present invention allows more flexibility for selecting attachment moieties which are better at selectively attaching to the source/drain electrodes but which have no dopant properties whatsoever. For example, while the benzonitrile dopants disclosed in US 2005/133782 can be used as p-type dopants for certain OSC materials and can, apparently, provide some attachment properties to palladium, the benzonitrile dopants will not be suitable for other OSC materials (for example, they cannot be used for n-type doping of n-type OSC materials) and may not provide good selective bonding to other types of source/drain material. In contrast, the present invention provides a thin self-assembled layer of material which can be optimized for both charge transfer and selective attachment for any given OSC and source/drain material.

The present invention allows a wide range of materials to be used to define the source/drain contacts and associated metal tracking which this layer is also expected to provide. Materials can be selected for their conductivity and processing benefits without the requirement for a work function of the material to match a specific OSC energy level. This will allow commonly used source/drain electrode materials such as gold (and palladium) to be replaced by low cost materials that are easier to pattern.

In addition to the above, it has been found that heavy metals such as gold tend to diffuse into the OSC and detrimentally affect the functional properties of the OSC during operation of organic thin film transistors. The present invention allows source/drain materials to be selected which do not suffer from these detrimental diffusion effects.

Further still, it has been found that the use of a dopant moiety and a separate attachment moiety results in particularly good charge transfer to/from an OSC which is deposited from solution. While not being bound by theory, it is believed that the attachment moiety allows the dopant moiety to project into the solution of OSC when it is deposited leading to better doping while the OSC film is drying.

The attachment moiety may be chemically bonded to the source/drain electrode, e.g. by one or more covalent bonds. Furthermore, the attachment moiety may be chemically bonded to the dopant moiety, e.g. by one or more covalent bonds. For example, the attachment moiety may comprise a leaving group such that the attachment moiety reacts with the material of the source and drain to from a bond therewith when said group leaves. For example, the attachment moiety may comprise at least one of a silyl group, a thiol group, an amine group and a phosphate group. It will be appreciated that the attachment moiety may be selected according to its ability to bind to the surface of the source and drain electrodes, which in turn will depend on the material being used for these electrodes. For example, thiols are particularly suited for binding to gold and silver, and silanes are suitable for binding to an oxide (e.g. SD electrodes comprising a metal with an oxidised surface.)

Such arrangements strongly anchor the dopant moiety to the source/drain electrode and prevent diffusion away from the source/drain in operation or removal of the dopant moiety in a washing step when removing excess dopant from other areas of the device such as the channel region.

The dopant moiety may be electron-accepting for accepting electrons from the organic semi-conductive material whereby the organic semi-conductive material is p-doped. Preferably, a p-dopant has a LUMO level less than $-4.3$ eV in order to readily accept electrons. The organic semi-conductive material for use with a p-dopant may have a HOMO level greater than or equal to $-5.5$ eV in order to donate electrons. Most preferably, for p-channel devices, the dopant has a LUMO level less than $-4.3$ eV and the organic semi-conductive material has a HOMO level greater than or equal to $-5.5$ eV.

To avoid any misunderstanding in relation to these negative values, the range "greater than or equal to $-5.5$ eV" encompasses $-5.4$ eV and excludes $5.6$ eV, and the range "less than $-4.3$ eV" encompasses $-4.4$ eV and excludes $-4.2$ eV.

It has been found that the combination of a semi-conductive organic material having a HOMO level greater than or equal to $-5.5$ eV and a dopant having a LUMO level less than $-4.3$ eV results in a conductive composition in the regions of source and drain contacts. While not been bound by theory, it is postulated that an organic semi-conductive material having a HOMO level of greater than or equal to $-5.5$ eV provides excellent hole transport and injection properties while the dopant having a LUMO level less than $-4.3$ eV readily accept electrons from such an organic semi-conductive material in order to create free holes in the organic semi-conductive material.

In the case of a p-dopant, the HOMO of the organic semi-conductive material is preferably higher (i.e. less negative) than the LUMO of the dopant. This provides better electron transfer from the HOMO of the organic semi-conductive material to the LUMO of the dopant. However, charge transfer is still observed if the HOMO of the organic semi-conductive material is only slightly lower than the LUMO of the dopant.

Preferably the organic semi-conductive material for a p-type device has a HOMO in the range 4.6-5.5 eV. This allows for good hole injection and transport from the electrodes and through the organic semi-conductive material.

Preferably, the dopant is a charge neutral dopant, most preferably optionally substituted tetracyanoquinodimethane (TCNQ), rather than an ionic species such as protonic acid doping agents. Providing a high concentration of acid adjacent the electrodes may cause etching of the electrodes with the release of electrode material which may degrade the overlying organic semi-conductive material. Furthermore, the acid may interact with organic semi-conductive material resulting in charge separation which is detrimental to device performance. As such, a charge neutral dopant such as TCNQ is preferred.

Preferably, the organic semi-conductive material is solution processable in order that they may be deposited by, for example, inkjet printing. Solution processable materials include polymers, dendrimers and small molecules.

Preferably, the optionally substituted TCNQ is a fluorinated derivative, for example, tetrafluoro-tetracyanoquinodimethane (F4-TCNQ). It has been found that this derivative is particularly good at accepting electrons.

The conductivity of the composition is preferably in the range $10^{-6}$ S/cm to $10^{-2}$ S/cm adjacent the electrodes. However, the conductivity of the compositions can be readily varied by altering the concentration of dopant, or by using a different organic semiconductive material and/or dopant, according to the particular conductivity value desired for a particular use.

As an alternative to the above described p-channel devices, the dopant moiety may be electron-donating for donating electrons to the organic semi-conductive material whereby the organic semi-conductive material is n-dope.

A spacer group may be provided between the attachment moiety and the dopant moiety. The spacer groups can be used to better dispose the dopant moieties within the OSC leading to better doping. Furthermore, the spacer groups can provide some flexibility in the surface onto which the OSC is to be deposited which can result in better film formation of the OSC thereon. The spacer group may be an alkylene chain, e.g. a $C_1$-$C_{20}$ alkylene chain. The spacer groups may be of different lengths so as to form a concentration gradient of dopant moiety which increases on approaching the source and drain electrodes.

For a bottom-gate device an organic dielectric material may be utilized to provide a large differential in the chemical properties of the dielectric layer and the source and drain electrodes such that selective binding of the attachment moiety to the source and drain electrodes is encouraged.

Similarly, for a top-gate device an organic substrate may be utilized to provide a large differential in the chemical properties of the dielectric layer and the source and drain electrodes such that selective binding of the attachment moiety to the source and drain electrodes is encouraged.

In another arrangement, the dielectric layer or the substrate may be treated to enhance the selective binding of the attachments moiety to the source and drain electrodes as opposed to the dielectric layer or the substrate.

According to another aspect of the present invention, there is provided an organic thin film transistor formed according to the previously described methods. The organic thin film transistor comprises a source and drain electrode and solution processable organic semi-conductive material disposed therebetween in a channel region, wherein the source and drain electrodes have disposed thereon a thin self-assembled layer of a material comprising a dopant moiety for chemically doping the organic semi-conductive material by accepting or donating charge and a separate attachment moiety bonded to the dopant moiety and selectively bonded to the source and drain electrodes.

According to another aspect of the present invention, there is provided a method of manufacturing a light-emissive device comprising: depositing a first electrode over a substrate; forming a thin self-assembled layer of a material on the first electrode, the thin self-assembled layer of material comprising a dopant moiety for chemically doping an organic charge transporting semi-conductive material by accepting or donating charge and a separate attachment moiety bonded to the dopant moiety and to the first electrode; depositing a solution comprising a solvent and an organic charge transporting semi-conductive material over the thin self-assembled layer; depositing an organic light-emissive material over the layer of organic charge transporting semi-conductive material; and depositing a second electrode over the organic light-emissive material.

According to this aspect of the invention, a light-emissive display is provided with a bottom electrode on which a self-assembled layer of material is disposed comprising a dopant moiety and a separate attachment moiety. Semi-conductive material is disposed thereover with the dopant moiety doping the semi-conductive material near the bottom electrode in order to form a conductive charge injecting layer. By attaching the dopant moiety to the electrode, the semiconductive material is doped more strongly near the electrode which is advantageous for charge injection from the anode into the light-emissive material disposed thereover. Thus, the present invention provides a replacement for the separately deposited conductive charge injection layer and semi-conductive charge transport layer utilized in the prior art.

The dopant moiety, attachment moiety and spacer moiety may be as described above in relation to the organic thin film transistor embodiment of the present invention.

According to another aspect of the present invention, there is provided a light-emissive device formed according to the previously described method. The light-emissive display comprises a substrate, a first electrode disposed over the substrate, a second electrode disposed over the first electrode, an organic light-emissive material disposed between the first and second electrodes, and a layer of organic charge transporting semi-conductive material disposed between the first electrode and the organic light-emissive material, wherein the first electrode has disposed thereon a thin self-assembled layer of a material comprising a dopant moiety for chemically doping the organic charge transporting semi-conductive material by accepting or donating charge and a separate attachment moiety bonded to the dopant moiety and to the first electrode.

According to another aspect of the present invention, there is provided an active matrix organic light-emissive display comprising a plurality of thin film transistors and a plurality of light-emissive devices formed according to the previously described aspects of the invention. In one particularly preferred embodiment, the bottom electrode of the organic light-emissive device and the source/drain electrodes of the organic thin film transistors are doped in a single method step. The doping may be using a common material or alternatively co-doping using a mixed dopant in a single step may be utilized.

SUMMARY OF THE DRAWINGS

The present invention will now be described in further detail, by way of example only, with reference to the accompanying drawings in which.

DETAILED DESCRIPTION OF PREFERRED EMBODIMENTS

Figure 1:
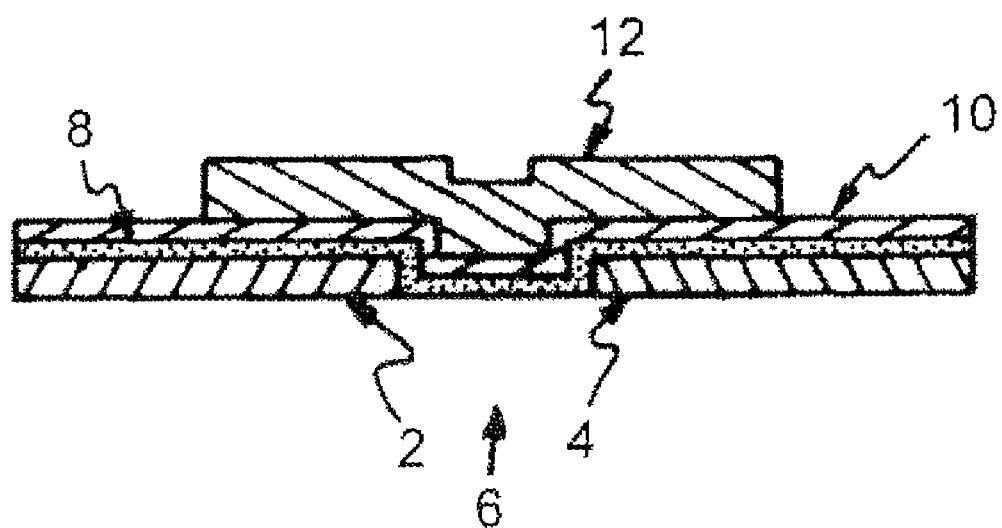
FIG. 1 shows a known top-gate organic thin film transistor arrangement.
Figure 2:
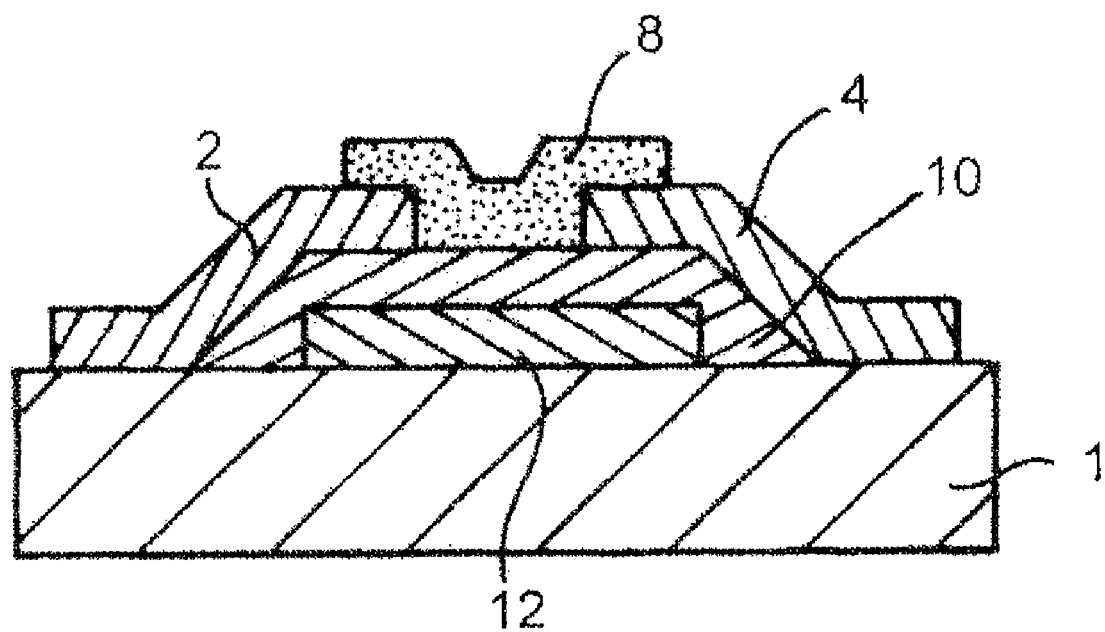
FIG. 2 shows a known bottom-gate organic thin film transistor arrangement.
Figure 3:
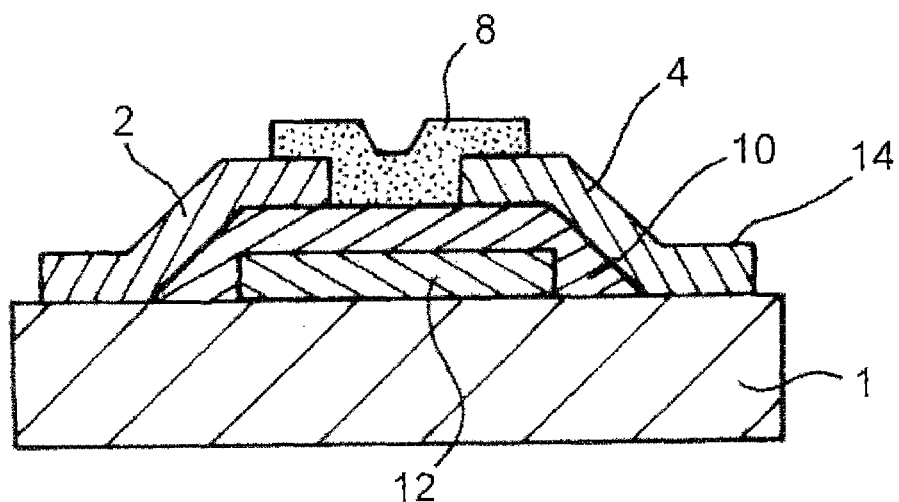
FIG. 3 shows an organic thin film transistor according to an embodiment of the present invention.

FIG. 3 shows a bottom-gate organic thin film transistor according to an embodiment of the present invention. The structure is similar to the prior art arrangement shown in FIG. 2 and for clarity like reference numerals have been used for like parts. The key difference of the arrangement shown in FIG. 3 is that the source and drain electrodes 2, 4 have disposed thereon a thin self-assembled layer of a material 14 comprising a dopant moiety for chemically doping the organic semi-conductive material by accepting or donating charge and a separate attachment moiety bonded to the dopant moiety and the source and drain electrodes.

Figure 4:
FIG. 4 illustrates the method steps involved in forming an organic thin film transistor according to the embodiment illustrated in FIG. 3.

A schematic diagram of the self-assembled layer 14 is illustrated in FIG. 4. For the example of gold or silver source-drain material, a dopant with a thiol attachment group could be used. A typical dopant molecule would include TCNQ, or F4TCNQ which has a deeper LUMO and is a more effective dopant (electron acceptor) with typical OSC materials.

Figure 5:
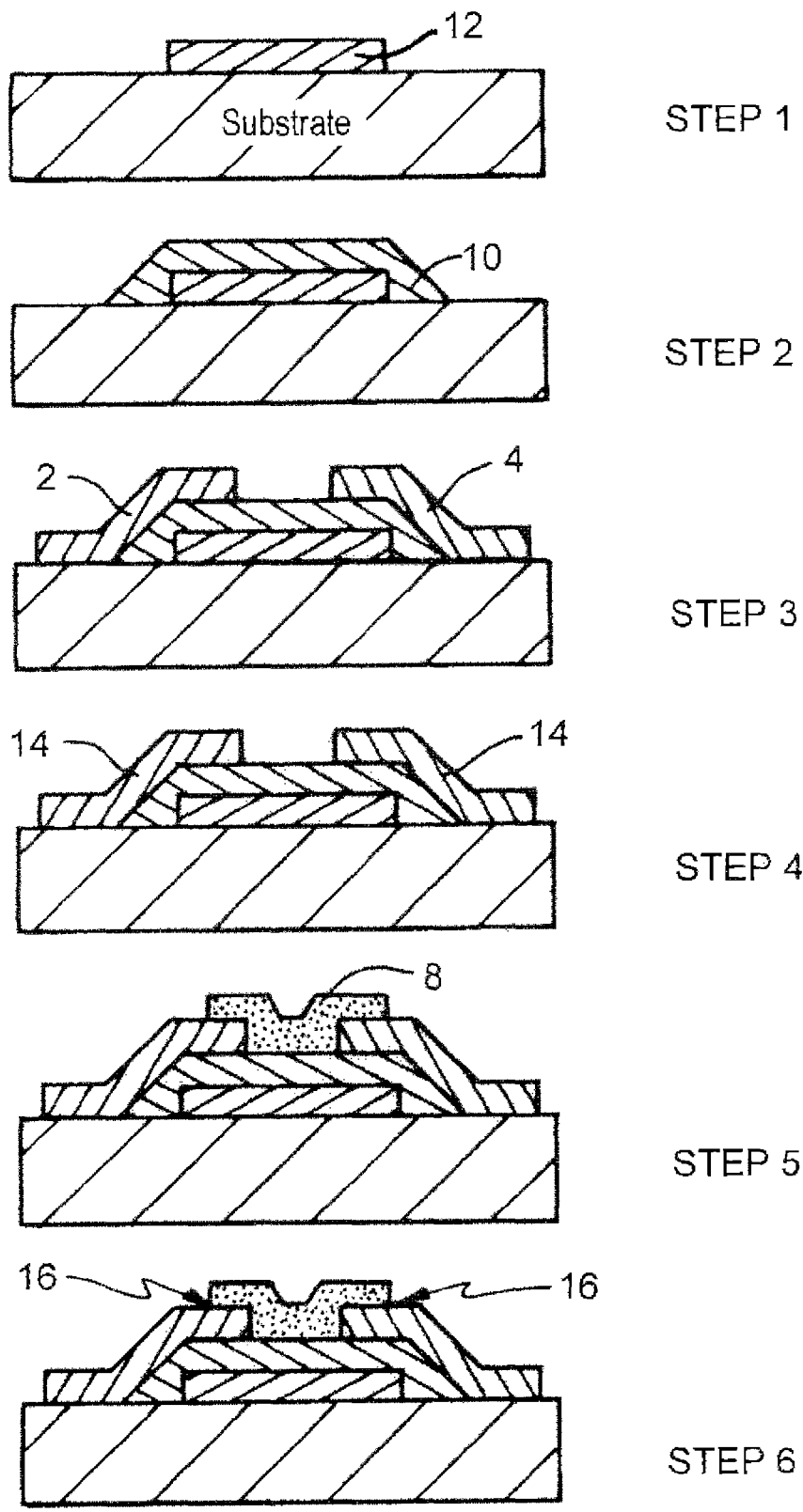
FIG. 5 shows a schematic diagram of a self-assembled layer according to an embodiment of the present invention.

The bottom-gate implementation illustrated in FIG. 3 is formed using the method illustrated in FIG. 5 in which schematic cross sections are shown.

Gate deposition and patterning 12 (e.g. patterning of an ITO-coated substrate).

Dielectric deposition and patterning 10 (e.g. cross-linkable, photopatternable dielectrics).

Source-drain material deposition and patterning 2, 4 (e.g. gold, photolithography).

Source-drain surface treatment 14. The surface treatment groups could be applied by dipping the substrate into a solution of the self-assembled-monolayer material, or applying by spin coating from a dilute solution. Excess (un-attached) material can be removed by washing. Use of a hydrophobic organic dielectric allows selectivity and prevents the attachment groups from attaching themselves to the channel region. If the channel region becomes doped the thin film transistor will allow current to flow from source to drain with the transistor in its off state. [Note that in order to make a depletion thin film transistor, for which a gate bias is applied to turn the transistor off, this effect could be a desirable route for controlled doping of the OSC in the channel region.]

Deposition of the OSC 8 (e.g. by ink jet printing of a solution processable polymer).

The dopant molecules interact with the OSC where they are in contact 16. For an acceptor dopant with a deep LUMO, electrons are transferred from the OSC to the dopant, rendering a localised region of the OSC conducting. This improves injection and extraction of charges at the source and drain contacts.

This technique is also compatible with top-gate devices. In this case, the source-drain layer is deposited and patterned first. The surface treatment is then applied to the source-drain layer prior to OSC, gate dielectric and gate deposition. An attachment moiety for the dopant is selected that does not attach itself to the exposed substrate in the region of the source-drain channel.

A treatment may be applied in specific locations to prevent attachment of the dopant. This may be required to prevent attachment to the channel region if selectively cannot be achieved directly.

Where the source-drain metal needs to be exposed (e.g. for electrical connection to a subsequent conducting layer) the dopant layer may need to be removed (e.g. by direct photo-patterning of a photo-reactive attachment group, laser ablation, etc) or prior surface patterning may be required to define where the dopant layer is required. Alternatively, if the dopant layer is thin and conducting enough, the dopant can be left in situ without impeding conducting via formation.

Figure 6:
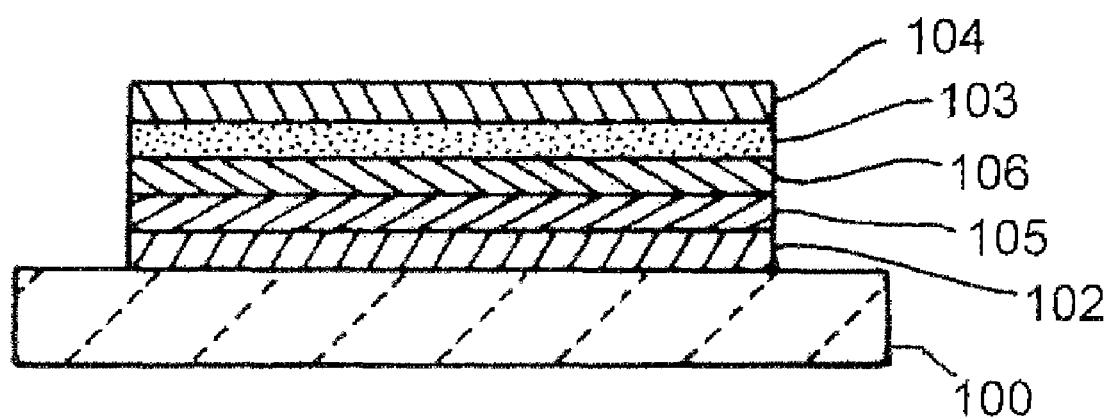
FIG. 6 shows a known organic light-emissive device arrangement.
Figure 7:
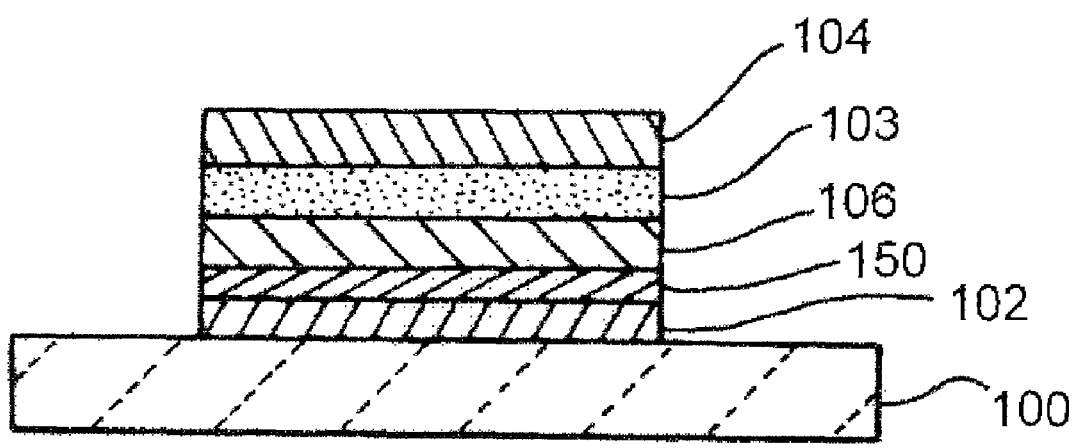
FIG. 7 shows an organic light-emissive device arrangement according to an embodiment of the present invention.

The previously described technique for organic thin film transistors can also be used in an organic light-emissive device in order to improve charge injection. FIG. 6, which has been previously described in the background section, shows the architecture of an organic light-emissive device according to a prior art device. According to an aspect of the present invention, the separate layers of conductive charge injecting material 105 and semi-conductive charge transporting material 106 are replaced with a self-assembled layer 150 of material comprising a dopant moiety and a separate attachment moiety with a semi-conductive material disposed thereover as illustrated in FIG. 7. The dopant moiety dopes the semi-conductive material 106 near the bottom electrode 102 in order to form a conductive charge injecting region with a semi-conductive region remaining thereover. By attaching the dopant moiety to the electrode 102, the semi-conductive material is doped more strongly near the electrode which is advantageous for charge injection from the anode into the light-emissive material 103 disposed thereover. Furthermore, as the dopant moiety is bound to the bottom electrode 102 it cannot diffuse through the device in use, which can be a problem in prior art arrangements, especially when highly acidic PEDT-PSS is utilized as a conductive hole injecting material which has been found to have detrimental effects on the other materials used in organic light-emissive devices.

The extent to which the semi-conductive charge transport material is doped can be controlled by using a spacer between the attachment moiety and the dopant moiety. A mixture of dopant molecules having different spacer lengths can be utilized in order to provide a controlled concentration gradient of the dopant through the semi-conductive material. Furthermore, the use of separate dopant and attachment moieties allows selection of an appropriate dopant for a specific semi-conductive material and an appropriate attachment moiety for a specific electrode material providing flexibility in device design.

Figure 8A:
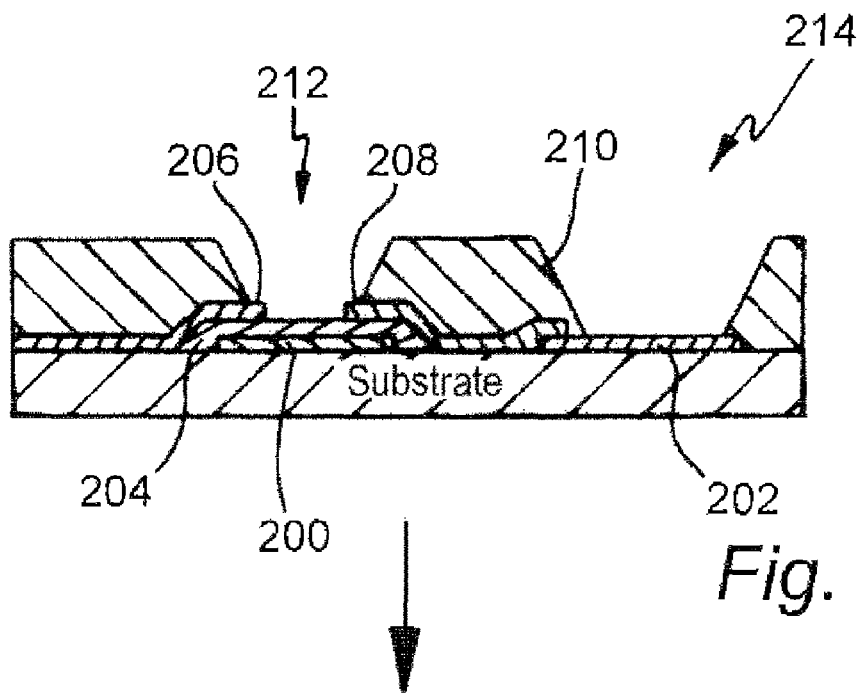
FIG. 8 shows an organic thin film transistor and an organic light emissive device in the process of being formed on a common substrate.

The organic thin film transistors and organic light-emissive devices described herein may be utilized in an active matrix organic light-emissive display in which the organic light-emissive devices constitute sub-pixels of the display which are driven by the organic thin film transistors. In one particularly preferred embodiment, the bottom electrode of the organic light-emissive device and the source/drain electrodes of the organic thin film transistors are doped in a single method step. The doping may be using a common material or alternatively co-doping using a mixed dopant in a single step may be utilized. FIG. 8 shows a portion of such a display during manufacture with an organic thin film transistor and an organic light emissive device being formed on a common substrate. The structure in FIG. 8(a) is formed by deposition and patterning a gate 200 and anode 202 by, e.g. patterning of an ITO-coated substrate. Dielectric material 204 is deposited and patterned, e.g. using a cross-linkable, photopatternable dielectric. Source-drain material 206, 208 is deposited and patterned, e.g. by depositing a layer of gold and patterning using photolithography. Bank material 210 is then deposited and patterned to form a bank structure with wells 212, 214 therein for the organic thin film transistor and the organic light-emissive device respectively.

Figure 8B:
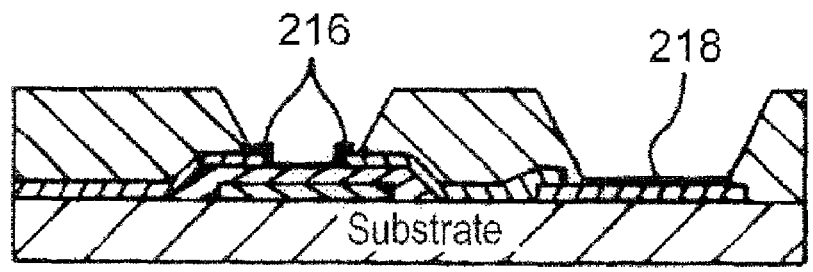

The key step illustrated in FIGS. 8(a) to 8(b) is that of depositing a self-assembled layer of material 216, 218 comprising a dopant moiety and a separate attachment moiety over the source and drain of the organic thin film transistor and the anode of the organic light-emissive device. As described previously, the attachment moiety is bonded to the dopant moiety and selectively binds to the source/drain and anode. In one particularly preferred arrangement, the anode of the organic light-emissive device and the source/drain electrodes of the organic thin film transistors are doped in a single method step. The doping may be using a common material. Alternatively co-doping using a mixed dopant may be utilized, one of the dopants in the mixture selectively binding to the source/drain and another of the dopants selectively binding to the anode.

Figure 9:
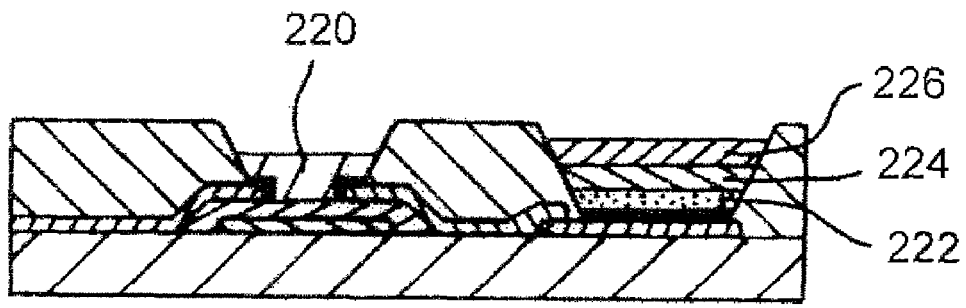
FIG. 9 shows an organic thin film transistor and an organic light emissive device formed on a common substrate.

After performing the doping step, the remaining layers of the organic thin film transistor and the organic light-emissive device can be deposited as shown in FIG. 9. An organic semi-conductive material 220 is deposited in the channel region between the source and drain of the organic thin film transistor. An organic charge transporting semi-conductive material 222, a light-emissive material 224, and a cathode 226 are deposited to form the organic light-emissive display.

Thus, it has been shown that the techniques described herein can be applied in organic thin film transistors, organic light-emissive devices, and active matrix organic light-emissive displays. However, while this invention has been particularly shown and described with reference to preferred embodiments thereof, it will be understood by those skilled in the art that various changes in form and details may be made therein without departing from the scope of the invention as defined by the appended claims.

The invention claimed is:

1. A method of manufacturing an organic thin film transistor, the method comprising: depositing a source electrode and a drain electrode; forming a thin self-assembled layer of material on the source and drain electrodes, the thin self-assembled layer of material comprising a dopant moiety for chemically doping an organic semi-conductive material by accepting or donating charge and a separate attachment moiety bonded to the dopant moiety and selectively bonded to the source and drain electrodes wherein a spacer group is provided between the attachment moiety and the dopant moiety; and depositing a solution comprising a solvent and an organic semi-conductive material in a channel region between the source and drain electrodes.

2. A method according to claim 1, wherein the thin self-assembled layer is a self-assembled mono-layer.

3. A method according to claim 1, wherein the attachment moiety is chemically bonded to the source and drain electrodes by one or more covalent bonds.

4. A method according to claim 1, wherein the attachment moiety is chemically bonded to the dopant moiety by one or more covalent bonds.

5. A method according to claim 1, wherein the attachment moiety is not a dopant moiety.

6. A method according to claim 1, wherein the attachment moiety comprises at least one of a silyl, a thiol, an amine, and a phosphate group.

7. A method according to claim 1, wherein the organic semi-conductive material is solution-processable.

8. A method according to claim 1, wherein doped organic semi-conductive material adjacent the source and drain electrodes has a conductivity in the range $10^{-6}$ S/cm to $10^{-2}$ S/cm.

9. A method according to claim 1, wherein the dopant moiety is a charge neutral dopant.

10. A method according to claim 1, wherein the dopant moiety is electron-accepting for accepting electrons from the organic semi-conductive material whereby the organic semi-conductive material is p-doped.

11. A method according to claim 10, wherein the dopant has a lowest occupied molecular orbital (LUMO) level less than −4.3 eV.

12. A method according to claim 10, wherein the organic semi-conductive material has a highest occupied molecular orbital (HOMO) level greater than or equal to −5.5 eV.

13. A method according to claim 10, wherein the highest occupied molecular orbital (HOMO) level of the organic semi-conductive material is higher than the lowest occupied molecular orbital (LUMO) level of the dopant.

14. A method according to claim 10, wherein the organic semi-conductive material has a highest occupied molecular orbital (HOMO) level in the range −4.6 to −5.5 eV.

15. A method according to claim 10, wherein the dopant is optionally substituted tetracyanoquinodimethane (TCNQ).

16. A method according to claim 15, wherein the optionally substituted TCNQ is a fluorinated derivative thereof.

17. A method according to claim 1, wherein the dopant moiety is electron-donating for donating electrons to the organic semi-conductive material whereby the organic semi-conductive material is n-doped.

18. A method according to claim 1, wherein the spacer group comprises an alkylene chain.

19. A method according to claim 18, wherein the alkylene chain is a $C_1$-$C_{20}$ alkylene chain.

20. A method according to claim 1, wherein spacer groups of different lengths are provided so as to form a concentration gradient of dopant moiety which increases on approaching the source and drain electrodes.

21. A method according to claim 1, wherein the organic thin film transistor is a bottom-gate device comprising a gate electrode disposed on a substrate and a layer of dielectric material disposed over the gate electrode, the source and drain electrodes being disposed over the dielectric material.

22. A method according to claim 21, wherein the dielectric material comprises an organic dielectric material.

23. A method according to claim 21, wherein the layer of dielectric material is treated to enhance selective binding of the attachment moiety to the source and drain electrodes.

24. A method according to claim 1, wherein the organic thin film transistor is a top-gate device in which the source and drain electrodes are disposed on a substrate, the organic semi-conductive material is disposed over the source and drain electrodes and in the channel region therebetween, a dielectric material is disposed over the organic semi-conductive material and a gate electrode is disposed over the dielectric material.

25. A method according to claim 24, wherein the substrate comprises an organic dielectric material.

26. A method according to claim 24, wherein the substrate is treated to enhance selective binding of the attachment moiety to the source and drain electrodes.

27. A method according to claim 11, wherein the organic semi-conductive material has a highest occupied molecular orbital (HOMO) level greater than or equal to −5.5 eV.

28. A method according to claim 27, wherein the highest occupied molecular orbital (HOMO) level of the organic semi-conductive material is higher than the lowest occupied molecular orbital (LUMO) level of the dopant.

29. A method according to claim 28, wherein the organic semi-conductive material has a highest occupied molecular orbital (HOMO) level in the range −4.6 to −5.5 eV.

* * * * *